(12) United States Patent
Samples

(10) Patent No.: US 8,034,666 B2
(45) Date of Patent: Oct. 11, 2011

(54) MULTI-LAYER THICK-FILM RF PACKAGE

(75) Inventor: Benjamin A. Samples, Bend, OR (US)

(73) Assignee: Microsemi Corporation, Bend, OR (US)

( * ) Notice: Subject to any disclaimer, the term of this patent is extended or adjusted under 35 U.S.C. 154(b) by 0 days.

(21) Appl. No.: 12/941,401

(22) Filed: Nov. 8, 2010

(65) Prior Publication Data
US 2011/0117705 A1    May 19, 2011

Related U.S. Application Data

(60) Provisional application No. 61/261,338, filed on Nov. 15, 2009.

(51) Int. Cl.
*H01L 21/50* (2006.01)
(52) U.S. Cl. ................. 438/125; 257/E21.499
(58) Field of Classification Search .............. 438/125; 257/E21.499
See application file for complete search history.

(56) References Cited

U.S. PATENT DOCUMENTS

| | | | |
|---|---|---|---|
| 3,387,190 A | 6/1968 | Winkler | |
| 3,555,375 A | 11/1968 | Hilbers | |
| 4,908,694 A | 3/1990 | Hidaka et al. | |
| 4,996,582 A | 2/1991 | Nagahama | |
| 5,155,575 A | 10/1992 | Zimmermann | |
| 5,170,337 A | 12/1992 | Borowiec et al. | |
| 5,465,008 A * | 11/1995 | Goetz et al. ................. | 257/691 |
| 5,524,339 A | 6/1996 | Gorowitz et al. | |
| 5,548,099 A | 8/1996 | Cole, Jr. et al. | |
| 5,602,421 A * | 2/1997 | Li ................................ | 257/728 |
| 5,683,943 A | 11/1997 | Yamada | |
| 5,939,774 A | 8/1999 | Yamada | |
| 6,008,068 A | 12/1999 | Yamada | |
| 6,670,216 B2 * | 12/2003 | Strauch ........................ | 438/106 |
| 6,798,060 B2 * | 9/2004 | Strauch ........................ | 257/705 |
| 6,943,293 B1 | 9/2005 | Jeter et al. | |
| 7,105,931 B2 | 9/2006 | Attarwala | |
| 7,134,197 B2 | 11/2006 | Shiffer et al. | |

(Continued)

FOREIGN PATENT DOCUMENTS

EP    0367680 A1    5/1990

(Continued)

OTHER PUBLICATIONS

Kyocera Semiconductor Parts Power Transistor Packages, Kyocera website, 2009.

(Continued)

*Primary Examiner* — Thao P. Le
(74) *Attorney, Agent, or Firm* — Marger Johnson & McCollom, P.C.

(57) ABSTRACT

A method for producing a multi-layer thick-film RF package includes forming conductive layer(s) including one or more source portions, one or more gate portions, and/or one or more drain portions on a ceramic substrate. The conductive layer(s) and the ceramic substrate are fired or otherwise heated in a furnace until sintered. Thereafter, a dielectric pattern is formed on the conductive layer(s) and fired or otherwise heated in the furnace until sintered. Then, a conductive bridge is formed on the dielectric pattern, over the one or more drain portions and between the one or more source portions, which is then fired until sintered in the furnace. As a result, a monolithic, single-piece, sintered, high-frequency RF power transistor package having circuit features including a highly conductive and low capacitive bridge is produced.

15 Claims, 7 Drawing Sheets

U.S. PATENT DOCUMENTS

| | | |
|---|---|---|
| 7,557,434 B2 | 7/2009 | Malhan et al. |
| 2002/0163070 A1* | 11/2002 | Choi .............................. 257/692 |
| 2003/0096450 A1* | 5/2003 | Strauch ........................ 438/106 |
| 2004/0014267 A1* | 1/2004 | Strauch ........................ 438/200 |
| 2004/0061221 A1 | 4/2004 | Schaffer |
| 2004/0195701 A1 | 10/2004 | Attarwala |
| 2005/0136569 A1 | 6/2005 | Shiffer et al. |
| 2005/0139990 A1* | 6/2005 | Kim .............................. 257/704 |
| 2006/0084254 A1 | 4/2006 | Attarwala |
| 2007/0145473 A1 | 6/2007 | Asano et al. |
| 2008/0019108 A1* | 1/2008 | Hoyer et al. ................. 361/760 |
| 2008/0054425 A1 | 3/2008 | Malhan et al. |
| 2008/0054439 A1 | 3/2008 | Malhan et al. |
| 2008/0060743 A1* | 3/2008 | Minamikawa et al. ..... 156/89.12 |
| 2008/0237840 A1 | 10/2008 | Alcoe et al. |
| 2009/0146280 A1 | 6/2009 | Shimazaki et al. |
| 2009/0261471 A1* | 10/2009 | Frey .............................. 257/703 |

FOREIGN PATENT DOCUMENTS

| | | |
|---|---|---|
| EP | 0844663 A1 | 5/1998 |
| EP | 1632998 A1 | 3/2006 |
| EP | 1662565 A2 | 5/2006 |
| EP | 1796163 A1 | 6/2007 |
| GB | 2444293 A | 6/2008 |
| GB | 2444978 A | 6/2008 |
| WO | 2005062371 A2 | 7/2005 |

OTHER PUBLICATIONS

Product Information Sheet, Standard RF Packages Jul. 1998, 1998 Kyocera America, Inc., two pages.

Product Information Sheet, Standard Microwave Package Jul. 1997, 1998 Kyocera America, Inc., two pages.

Components for Wireless Communication Devices, http://global.kyocera.com/prdct/semicon/semi/wireless/index.html, downloaded from the internet, Oct. 27, 2010, Kyocera Corporation, two pages.

RF Power Transistor Packages, Components for Wireless Communication Devices, http://global.kyocera.com/prdct/semicon/semi/wireless/fet_pkg.html, downloaded from the internet, Oct. 27, 2010, Kyocera Corporation, one page.

\* cited by examiner

MULTI-LAYER THICK-FILM RF PACKAGE

CROSS REFERENCE TO RELATED APPLICATION

This application claims the benefit of U.S. Provisional Patent Application Ser. No. 61/261,338, filed Nov. 15, 2009, herein incorporated by reference.

BACKGROUND

1. Technical Field

This disclosure relates to RF power transistors, and more particularly to power transistor packages.

2. Discussion of Related Art

Conventional high frequency power transistor packages use of a variety of mechanical components to provide RF signal stability and integrity.

For example, U.S. Pat. No. 3,555,375 entitled High Frequency Power Transistor Having Crossing Input and Output Leads describes a technique in which compensation for stray inductive feedback coupling is achieved by crossing input and output leads. Specifically, a high frequency transistor is described having input, output, and common leads. In order to reduce the unwanted feedback effect of a stray series inductance in the common lead, the output leads are arranged so as to cross one another in such close proximity as to inductively couple them together, thereby providing a feedback opposite to that of the stray inductance in order to compensate for the stray inductance.

FIGS. 1-3 show an example of a prior art RF package in which a flanged base has arranged thereon various circuit and mechanical components such as a lead frame, a MOSFET die, source, drain, and gate leads, wire bonds, and so forth. The various parts and interconnects are distinct from the substrate and generally distinct from each other. In other words, the parts and interconnects are manufactured separately and are later mechanically assembled to form the package. While the arrangement of such components can improve signal stability and integrity to some degree, producing such packages is costly. Moreover, frequency stability and conductivity of the prior art parts is not necessarily optimal.

The mechanical construction and assembly of the separate components of the package result in higher manufacturing and labor costs, which is of critical importance when producing the packages in high quantities. Moreover, lower electrical conductivity of the parts themselves inhibits the performance of the circuit components, leads, and other electrical parts associated with the package. It would be desirable to have a sintered, monolithic package having circuit features and electrical components integrated thereon to reduce the cost associated with producing the packages, and to enhance operational characteristics and capabilities. Accordingly, a need remains for an improved RF package and method for producing the same.

SUMMARY OF EMBODIMENTS OF THE INVENTION

In an example embodiment of the invention, a multi-layer thick-film RF power transistor package is provided. The RF package is a single-piece, monolithic, sintered, high-frequency package having circuit features including a highly conductive and low capacitive source bridge.

A method of fabricating the RF package includes forming conductive layer(s) including one or more source portions, one or more gate portions, and/or one or more drain portions on a ceramic substrate. The conductive layer(s) and the ceramic substrate are fired or otherwise heated in a furnace until sintered. Thereafter, a dielectric pattern is formed on the conductive layer and fired or otherwise heated in the furnace until sintered. Then, a conductive bridge is formed on the dielectric pattern, over the one or more drain portions and between the one or more source portions, which is then fired until sintered in the furnace.

In another example embodiment of the present invention, different materials are used for different parts of the RF package to increase conductivity and reduce migration between the conductive and dielectric layers. For example, some portions of the conductive layer can be formed using silver (Ag) thick-film paste, while other portions, specifically the bridge and drain portions, can be formed using gold (Au) thick-film paste. The dielectric layer includes openings in which electrical interfaces between the conductive portions and one or more dies can be formed using wire bonds. The dielectric layer also includes notches through which source leads, drain leads, and gate leads can be electrically coupled to source portions, drain portions, and gate portions, respectively, of the conductive layer(s).

The foregoing and other features and advantages of the invention will become more readily apparent from the following detailed description of a preferred embodiment of the invention that proceeds with reference to the accompanying drawings.

DETAILED DESCRIPTION

Figure 1:
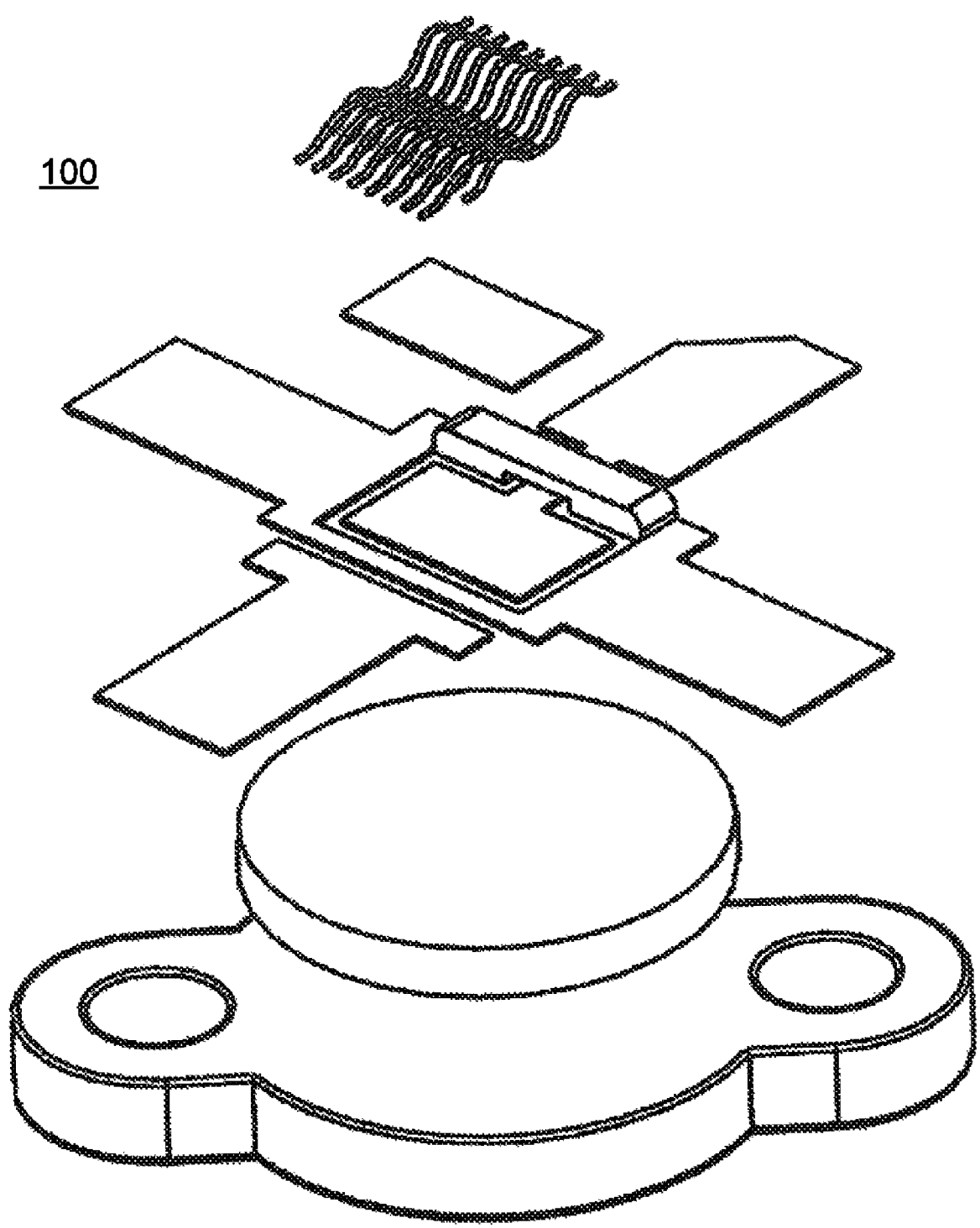
FIGS. 1-3 illustrate a conventional RF power transistor package having various circuit and mechanical components arranged thereon.
Figure 2:
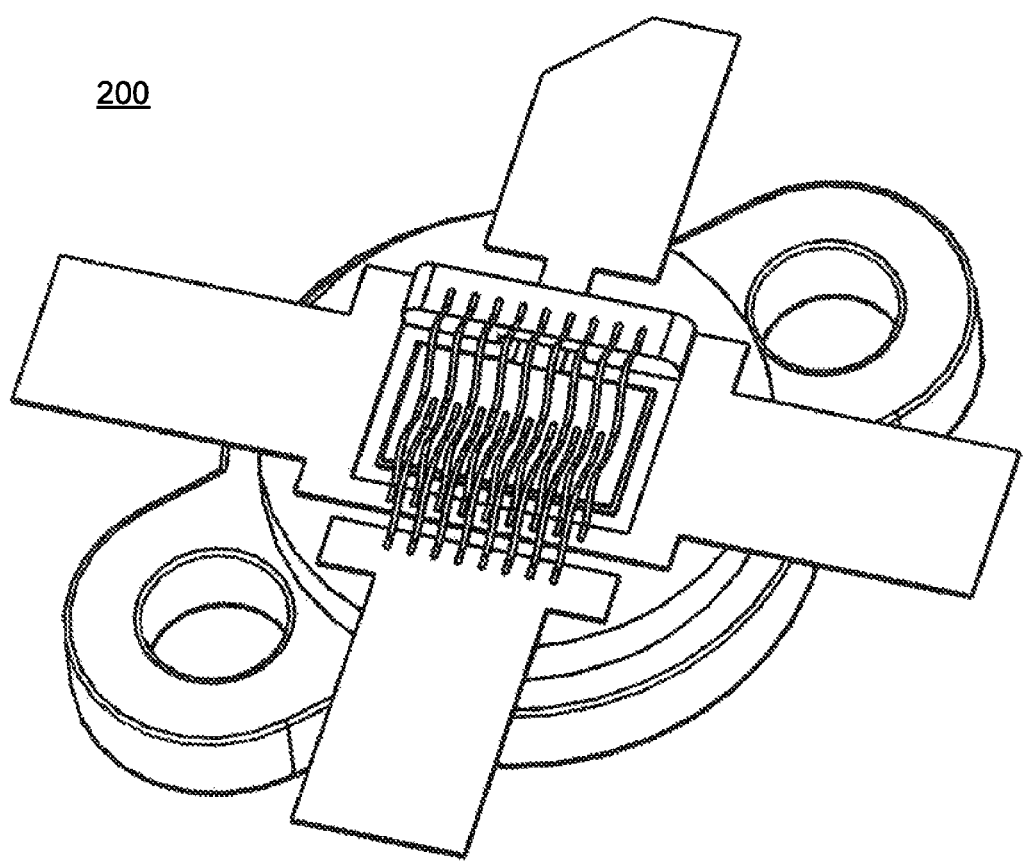
Figure 3:
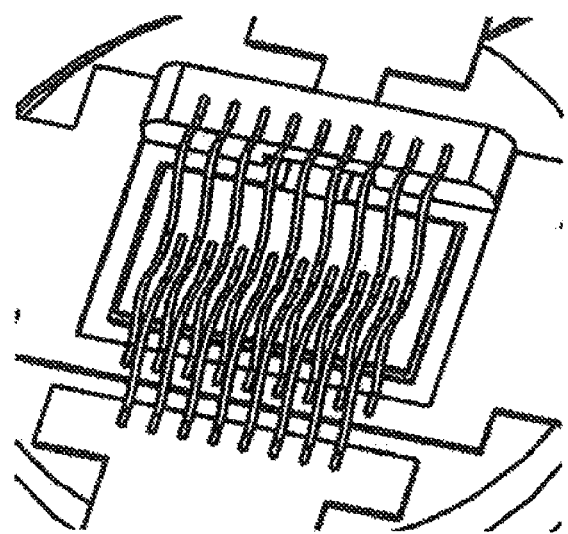
Figure 4:
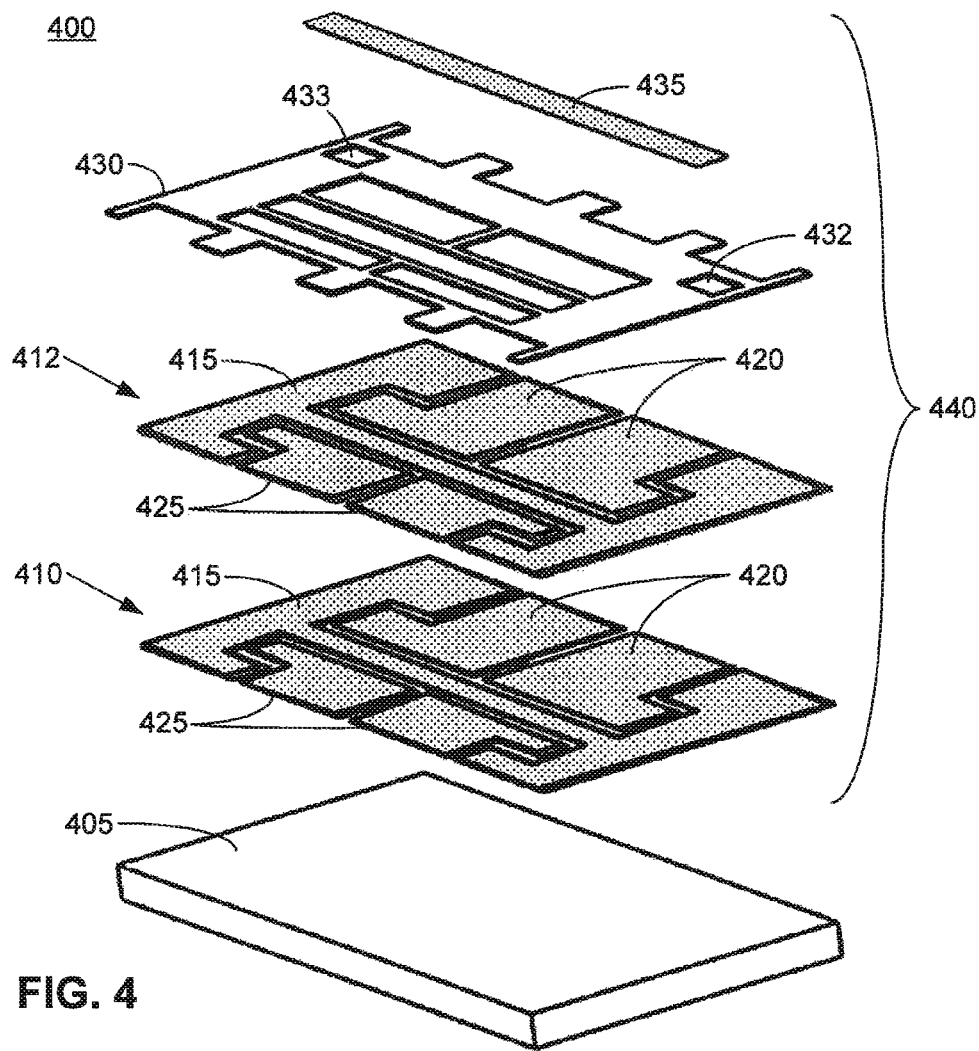
FIGS. 4 and 4A illustrate exploded views of a substrate and multi-layer thick-film RF components, according to some embodiments of the present invention.
Figure 5:
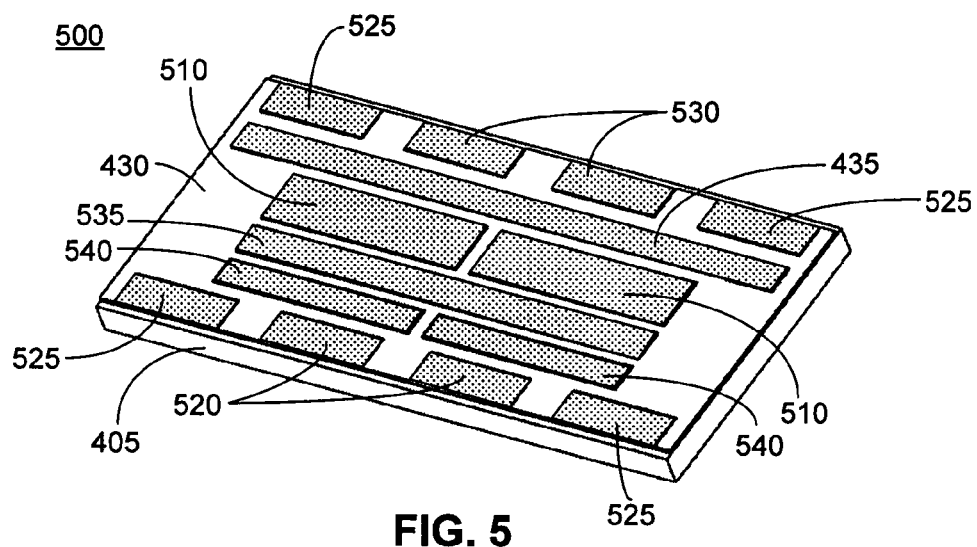
FIGS. 5 and 5A illustrate monolithic, fired and sintered multi-layer substrates having circuit features associated with the components and layers shown in FIGS. 4 and 4A, respectively, after various stages of printing and firing thick-film layers on the substrate.

FIG. 4 illustrates an exploded view 400 of a substrate 405 and multi-layer thick-film RF components 440, according to some embodiments of the present invention. FIG. 5 illustrates a monolithic, fired and sintered multi-layer substrate 500 having circuit features associated with the components and layers shown in FIG. 4 after various stages of printing and firing thick-film layers on the substrate, which are described in detail below. Reference is now made to FIGS. 4 and 5.

A multi-layer thick-film RF package 500 includes a rectangular ceramic substrate 405, on which various layers and patterns 440 are printed and fired to form the single-piece, monolithic and sintered multi-layer substrate 500 having integral conductor and dielectric layers. While a rectangular substrate is disclosed and illustrated, and is the preferred shape for the RF package to accommodate the arrangement of components associated therewith, it should be understood that the substrate and corresponding layers can include other forms or shapes and still fall within the scope of this disclosure.

Producing the multi-layer thick-film RF package 500 involves printing using a screen printer or otherwise disposing various thick-film layers of conductive and dielectric materials in predefined patterns on the substrate 405. At different stages, the layers are fired or otherwise heated in a furnace to form the single-piece, monolithic and sintered multi-layer package 500. The method for producing the package 500 begins by forming a conductive layer 410 including one or more source portions 415, one or more drain portions 420, and/or one or more gate portions 425 on a ceramic substrate 405. The source portions 415 are associated with source terminals of an RF power transistor die (not shown), the drain portions 420 with drain terminals of the die, and the gate portions 425 with gate terminals of the die.

The conductive layer 410 taken together can have a generally rectangular pattern associated with rectangular ceramic substrate 405. While the different portions of conductive layer 410 are printed or disposed in a particular pattern as illustrated in FIG. 4, it should be understood that this is an example pattern delineating the various portions, and other suitable patterns that achieve the function of dividing the layer 410 into source, drain, and/or gate portions also fall within the inventive principles of this disclosure.

In some embodiments, a first conductive layer 410 is printed using a screen printer or otherwise formed on the ceramic substrate 405, and includes, for example, a conductive paste having at least silver (Ag) and palladium (Pd). The palladium impedes mobility of the silver into neighboring dielectric layers, as explained in more detail below. Ag to Pd ratios in the conductive paste can range, for example, from 2.1:1 to 6:1. In other words, 2.1 parts of Ag to 1 part of Pd on one end of the range, and 6 parts of Ag to 1 part of Pd on the other end of the range, and including any suitable ratio between this range. Examples of suitable conductive pastes include LORD 3503, 3504, 3542, or 3543 thick-film pastes, and DuPont™ 4083 or 5082 thick-film pastes.

After the first conductive layer 410 is printed on the ceramic substrate 405, the substrate is inserted into a furnace and the conductive layer 410 and the ceramic substrate 405 are fired or otherwise heated until sintered. The substrate is then removed from the furnace and an optional second conductive layer 412 is formed on the first conductive layer 410. The second conductive layer 412 is patterned to substantially match that of the first conductive layer 410, and includes the one or more source portions 415, the one or more drain portions 420, and the one or more gate portions 425.

In some embodiments, the second conductive layer 412 can include a conductive paste having at least silver (Ag) and palladium (Pd), similar to the first conductive layer 410. However, the second conductive layer 412 preferably includes a composition of Ag and Pd at a ratio different from the composition used for the first conductive layer 410. For instance, the first conductive layer 410 can include a composition of Ag and Pd at a first ratio that provides improved adhesion of the conductive paste to the ceramic substrate. The preferred material for the first conductive layer is DuPont™ 4083 thick-film paste. The second conductive layer 412 can include a composition of Ag an Pd at a second ratio, different from the first ratio, and which provides improved solder and wire bond attachment. The preferred material for the second conductive layer is DuPont™ 5082 thick-film paste.

After the second conductive layer 412 is printed or otherwise formed on the first conductive layer 410, the substrate is inserted into the furnace and the conductive layers 410/412 and the ceramic substrate 405 are fired or otherwise heated until sintered. The substrate is then removed from the furnace.

A dielectric pattern 430 is then formed on the conductive layer or layers. Ag migration from the conductor layer(s) into the dielectric material can be caused by the electrical potential difference between the drain and source portions of the conductive layer(s), and can be accelerated by high temperature applications. To impede or even stop such migration, the dielectric material used in forming the dielectric pattern 430 can include glass paste or a re-crystallizable glass that inhibits the Ag migration. The preferred dielectric thick-film glass paste is DuPont™ QM44H, although other dielectric thick-film glass pastes can also be used, such as LORD 7600A.

After printing or otherwise disposing the dielectric material to form dielectric pattern 430 on the conductive layer(s), the substrate is inserted into the furnace and the dielectric pattern 430 is fired or otherwise heated until sintered. The dielectric pattern 430 is designed to expose different sections of the various source, drain, and gate portions of the conductive layer(s). For example, the dielectric pattern 430 can include one or more openings 432/433 for bridge connections to the one or more source portions 415, as will be discussed in more detail below. In addition, the dielectric pattern 430 can include other openings such as die openings 510, elongated source bond opening 535 for interfacing with the one or more source portions 415, and gate bond openings 540 for interfacing with the one or more gate portions 425.

Moreover, notches 530 are provided in the dielectric pattern 430 so that an electrical coupling can be made to one or more drain leads (not shown). Similarly, notches 525 are provided so that an electrical coupling can be made to one or more source leads (not shown), and notches 520 are provided so that an electrical coupling can be made to one or more gate leads (not shown). The leads are later shown and described in detail below.

After the dielectric pattern 430 is formed, a conductive bridge 435 is formed on the dielectric pattern 430, over the one or more drain portions 420 and between the one or more source portions 415. Forming the conductive bridge 435 can include screen-printing a conductive paste on the dielectric pattern 430 over the one or more drain portions 420. In other words, a "source bridge" is formed to connect one part of the source portion 415 through opening 432 to another part of the source portion 415 through opening 433, which results in a bridge over the drain portions 420.

In some embodiments, the conductive paste used to form the source bridge includes at least silver (Ag) and palladium (Pd), similar to (or the same as) that described above with reference to the conductive layer(s). The bridge 435 provides electrical communication with the one or more source portions 415 through the openings 432 and 433, and is structured to bridge the one or more source portions 415 over the one or more drain portions 420.

After the source bridge 435 is printed or otherwise disposed on the dielectric pattern 430, the substrate including the source bridge, the dielectric pattern, the conductive layer(s), etc., are again fired in the furnace until at least the source bridge 435 is sintered. The result is a single-piece, monolithic and sintered multi-layer thick-film RF package 500 having circuit features incorporated therein, such as the source, drain, and gate portions, bond openings, source bridge, notches, etc.

Figure 4A:
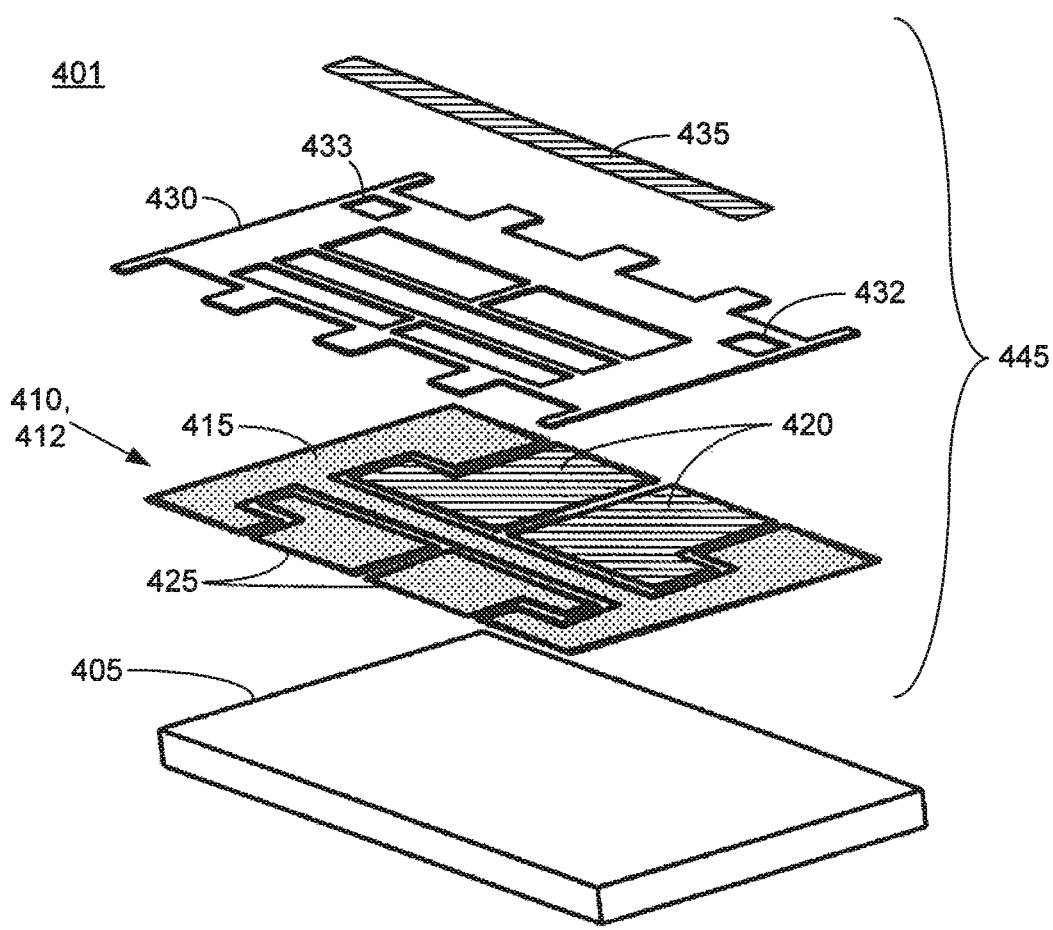
Figure 5A:
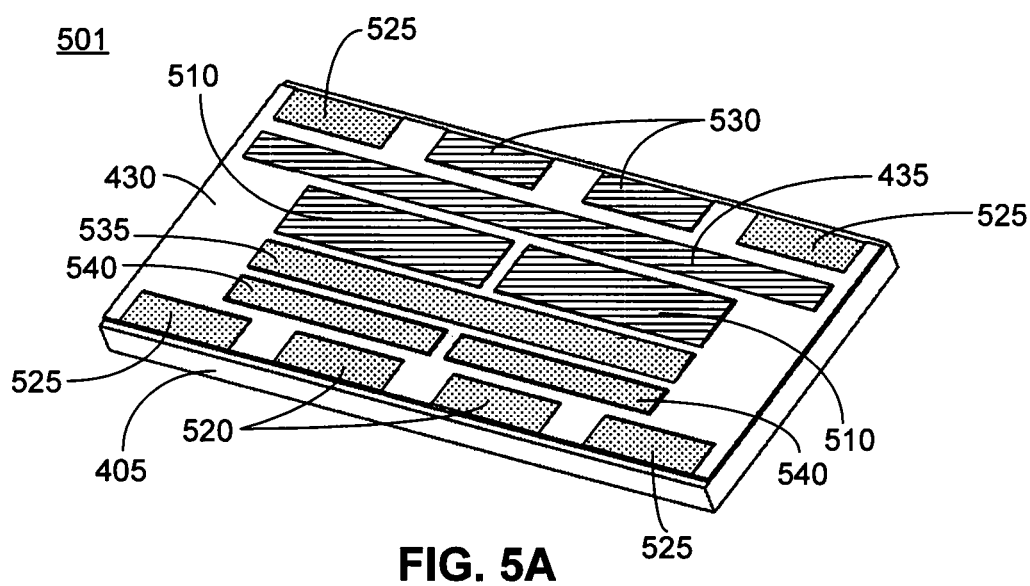

FIG. 4A illustrates an exploded view 401 of a substrate 405 and multi-layer thick-film RF components 445, according to some embodiments of the present invention. FIG. 5A illustrates a monolithic, fired and sintered multi-layer substrate 501 having circuit features associated with the components and layers shown in FIG. 4A after various stages of printing and firing thick-film layers on the substrate, which are described in detail below. Reference is now made to FIGS. 4A and 5A.

Many of the components illustrated in FIGS. 4A and 5A correspond to similar components as shown in FIGS. 4 and 5, and therefore, a detailed description of such components is omitted for the sake of brevity.

To further mitigate or even altogether prevent Ag migration between the conductive and dielectric components of the RF package 501, gold (Au) thick-film paste can be used in lieu of silver (Ag), in some or all of the conductive portions or components. In this manner, migration is further reduced because of a tendency for Au not to spread into the dielectric. Due to the higher cost of Au, a subset of the components of the RF package 501 can be formed using Au while the remaining components can be formed using Ag, thereby reducing the overall cost of the RF package while reducing migration and improving performance. Alternatively, all of the conductive components can be formed using Au thick-film paste.

In some embodiments, forming the conductive layer 410 includes printing a conductive paste having at least Ag and Pd on the ceramic substrate 405 to form the one or more source portions 415, and printing a conductive paste having at least Au on the ceramic substrate 405 to form the one or more drain portions 420. Moreover, forming the conductive bridge 435 can include printing a conductive paste having at least Au on the dielectric pattern 430 and over the one or more drain portions 420. In other words, the one or more source portions 415 and the one or more gate portions 425 can include a composition having at least Ag and Pd, while the conductive bridge 435 and the one or more drain portions 420 include a composition having at least Au.

Examples of suitable Ag conductive pastes include LORD 3503, 3504, 3542, or 3543 thick-film pastes, and DuPont™ 4083 or 5082 thick-film pastes. Examples of suitable Au conductive pastes include LORD 3614 or 3612 thick-film paste, and DuPont™ 5771 thick-film paste. Preferably, the Au paste has high solder and wire bond adhesion properties as well as a high Au content, such as the DuPont™ 5771 thick-film paste.

Figure 6:
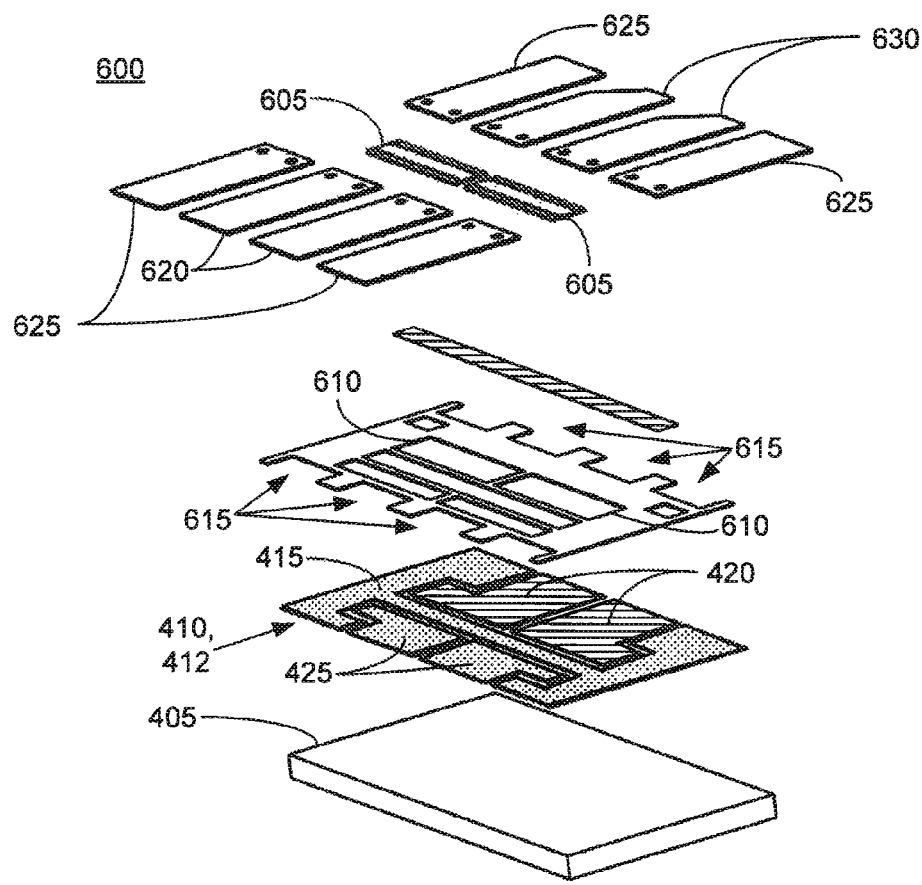
FIG. 6 illustrates an exploded view of the substrate and multi-layer thick-film RF components of FIG. 4A, and further including silicon dies and various leads according to some embodiments of the present invention.
Figure 7:
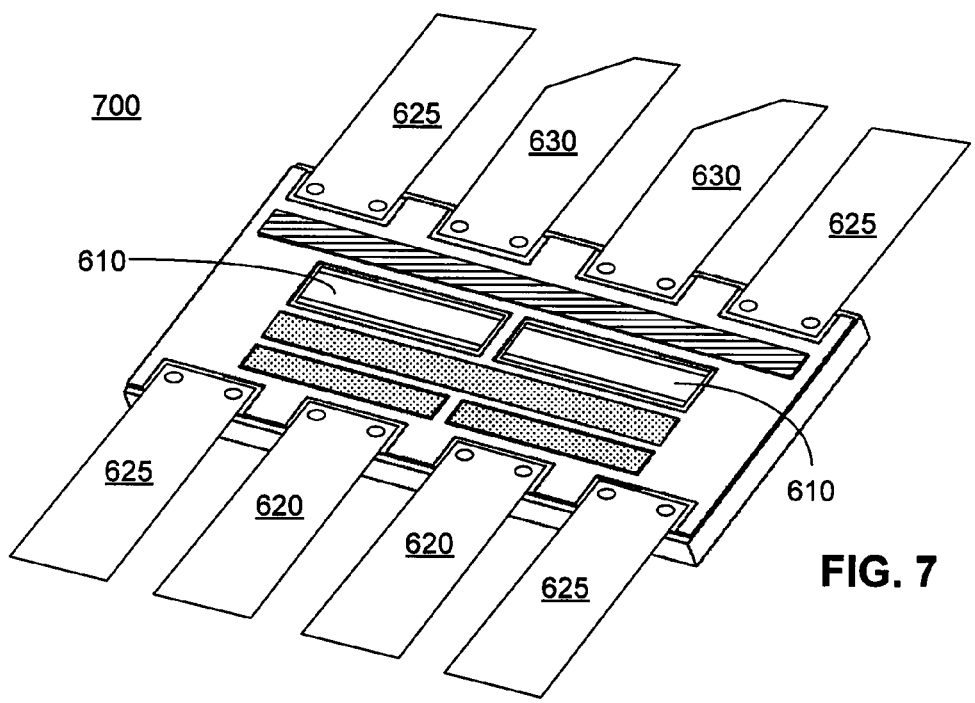
FIG. 7 illustrates a monolithic, fired and sintered multi-layer substrate having circuit features associated with the components and layers shown in FIG. 6, after various stages of printing and firing thick-film layers on the substrate, and after arranging the dies and leads thereon.

FIG. 6 illustrates an exploded view 600 of the substrate 405 and multi-layer thick-film RF components 445 of FIG. 4A, and further including silicon dies 605 and various leads 620, 625, and 630 according to some embodiments of the present invention. FIG. 7 illustrates a monolithic, fired and sintered multi-layer substrate 700 having circuit features associated with the components and layers shown in FIG. 6, after various stages of printing and firing thick-film layers on the substrate, and after arranging the dies and leads thereon. Reference is now made to FIGS. 6 and 7.

Many of the components illustrated in FIGS. 6 and 7 correspond to similar components as shown in FIGS. 4, 4A, 5, and 5A, and therefore, a detailed description of such components is omitted for the sake of brevity.

The method for producing the multi-layer thick-film RF package 700 can include disposing one or more dies 605 on the one or more drain portions 420 through the one or more openings 610, thereby electrically coupling a lower surface of the dies to the one or more drain portions 420. In addition, the method can include disposing one or more leads 620, 625, and/or 630 on the conductive layer(s) 410/412 through one or more notches 615.

In this manner, the gate leads 620 are electrically coupled to the one or more gate portions 425, the source leads 625 are electrically coupled to the one or more source portions 415, and the drain leads 630 are electrically coupled to the one or more drain portions 420. The leads can be attached to the conductive layer(s) 410/412 using bolts, rivets, adhesive, or other suitable attaching means.

Figure 7A:
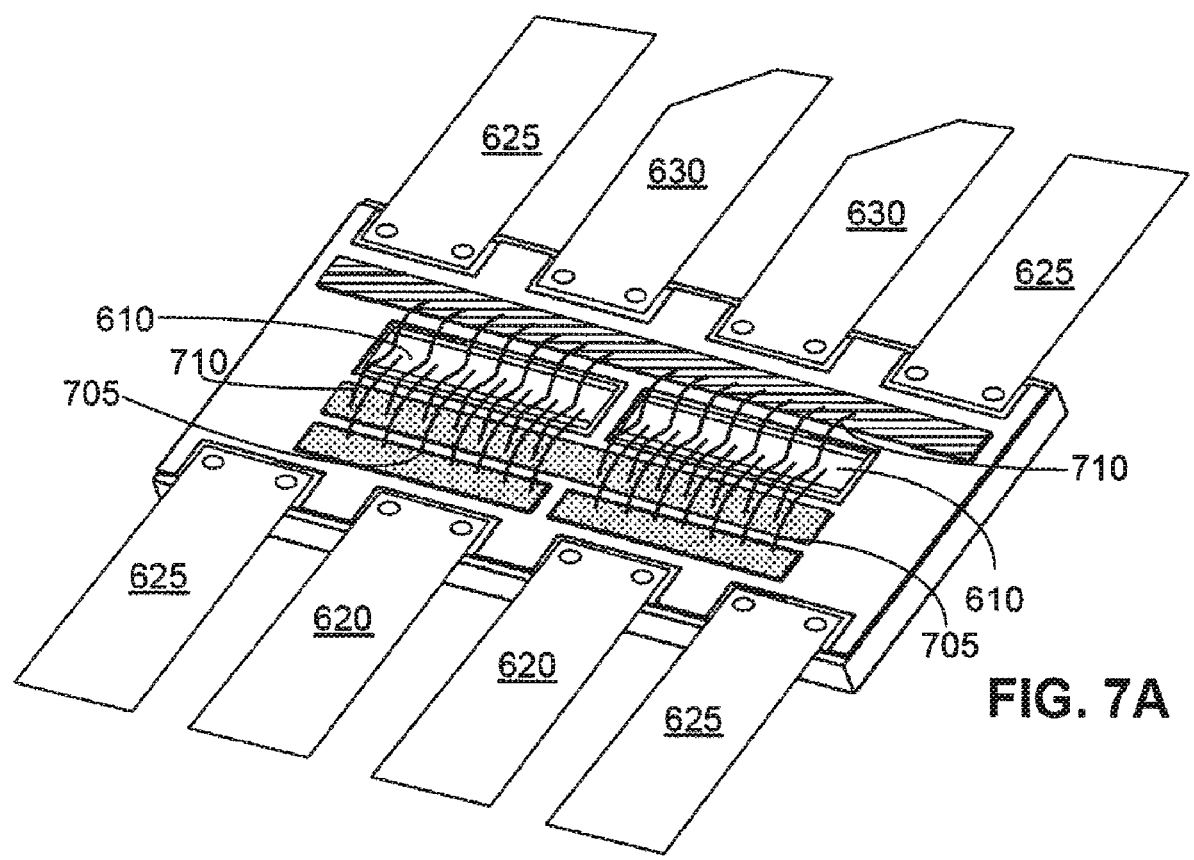
FIG. 7A illustrates the monolithic, fired and sintered multi-layer substrate of FIG. 7, and further including wire bonds according to some embodiments of the present invention.

FIG. 7A illustrates the monolithic, fired and sintered multi-layer substrate 700 of FIG. 7, and further including wire bonds 705/710 according to some embodiments of the present invention. The wire bonds 710 electrically couple the one or more dies 610 to the one or more source portions 415 via the elongated source bond opening 535 and the source bridge 435. The wire bonds 705 electrically couple the one or more dies 610 to the one or more gate portions 425 via the gate bond openings 540. The one or more drain portions 420 are directly electrically coupled to a lower surface of the one or more dies 610.

Figure 8:
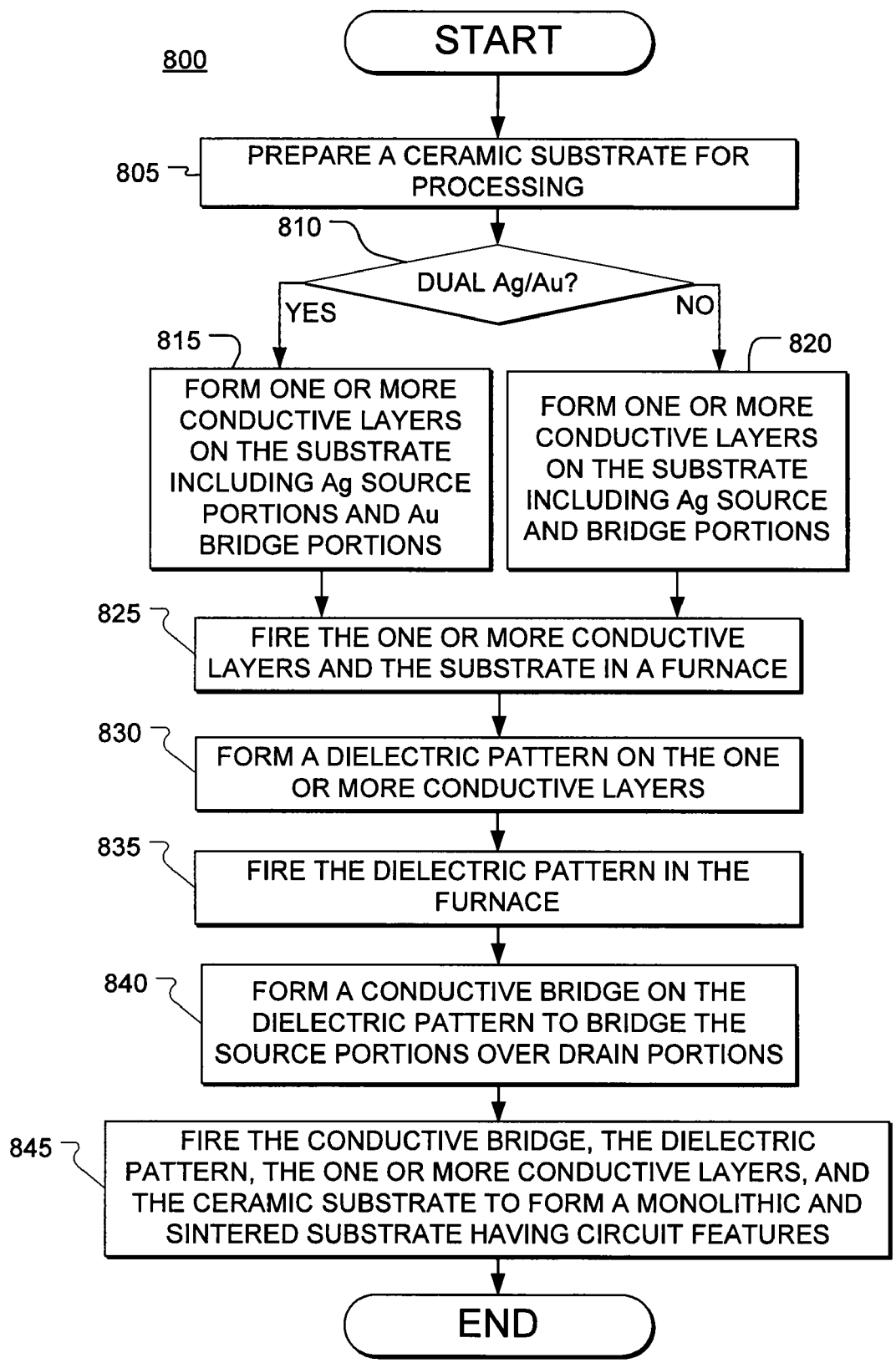
FIG. 8 is a flow diagram for illustrating a manufacturing process and technique in which the monolithic and sintered substrates are produced according to embodiments of the present invention.

FIG. 8 is a flow diagram 800 for illustrating a manufacturing process and technique in which the monolithic and sintered substrates are produced according to embodiments of the present invention. The technique begins at 805 where a ceramic substrate is prepared for processing. Preferably, a bare ceramic substrate is prepared and arranged for subsequent adding of conductive and dielectric layers to form the single-piece RF package.

At 810, a determination is made whether to produce the dual Ag/Au embodiment of the package, as described above. If NO, the flow proceeds to 820 where one or more conductive layers is formed on the substrate including Ag source and bridge portions. Otherwise, if YES, then the flow proceeds to 815 where one or more conductive layers is formed on the substrate including Ag source portions and Au bridge portions. In either case, the one or more conductive layers and the substrate are fired in a furnace at 825 until sintered.

The flow proceeds to 830 where a dielectric pattern is formed on the one or more conductive layers. At 835, the dielectric pattern is fired in the furnace until sintered. Subsequently, a conductive bridge is formed on the dielectric pattern to bridge the source portions over the drain portions. Then, the conductive bridge, the dielectric pattern, the one or more conductive layers, and the ceramic substrate are fired in the furnace to form a monolithic, single-piece, sintered substrate having circuit features, as described above.

Having illustrated and described the principles of my invention in various embodiments thereof, it should be apparent that the invention can be modified in arrangement, detail and application without departing from such principles. The inventive principles described herein provide a high-frequency RF power transistor package having unusual characteristics of high bridge electrical conductivity, low bridge capacitance, and increased component frequency stability.

While some embodiments described herein are especially useful in packaging RF power devices, embodiments of the invention can be configured for use with other types of devices such as lower frequency devices. For instance, the terminology "gate," "source" and "drain" leads pertains to MOSFET type devices. It is contemplated that embodiments of the invention can also be used with bipolar type devices and IGBT devices. In the case of bipolar devices, gate corresponds to base, source corresponds to emitter and drain corresponds to collector. In the case of an IGBT device, gate remains gate, source corresponds to emitter and drain corresponds to collector. The terms gate, source and drain will be used throughout but are meant to include base-emitter-collector and gate-emitter-collector leads.

I claim all modifications and variations coming within the spirit and scope of the following claims:

1. A method for producing a multi-layer thick-film RF package, the method comprising:
   forming a conductive layer including one or more source portions and one or more drain portions on a ceramic substrate;
   firing the conductive layer and the ceramic substrate in a furnace;
   forming a dielectric pattern on the conductive layer;
   firing the dielectric pattern in the furnace;
   forming a conductive bridge on the dielectric pattern, over the one or more drain portions and between the one or more source portions and,
   forming the dielectric pattern includes printing a glass paste on the conductive layer, the glass paste forming the dielectric pattern.

2. The method of claim 1, further comprising:
   firing the conductive bridge, the dielectric pattern, the conductive layer, and the ceramic substrate in the furnace to form a monolithic and sintered substrate having circuit features.

3. The method of claim 1, wherein forming the conductive bridge includes printing a conductive paste on the dielectric pattern over the one or more drain portions.

4. The method of claim 3, wherein forming the conductive bridge further includes connecting the one or more source portions through one or more openings in the dielectric pattern.

5. The method of claim 1, wherein the conductive layer comprises a first conductive layer, the method further comprising:
   forming a second conductive layer including the one or more source portions and the one or more drain portions on the first conductive layer; and
   firing the second conductive layer in the furnace.

6. The method of claim 5, wherein the first conductive layer includes a first composition of at least silver (Ag) and palladium (Pd) at a first ratio, and the second conductive layer includes a second composition of at least silver (Ag) and palladium (Pd) at a second ratio.

7. The method of claim 1, wherein forming the conductive layer includes printing a conductive paste on the ceramic substrate, the conductive paste forming the one or more source portions, the one or more drain portions, and one or more gate portions.

8. The method of claim 1, wherein:
   forming the conductive layer includes printing a conductive paste having at least silver (Ag) and palladium (Pd) on the ceramic substrate to form the one or more source portions, and printing a conductive paste having at least gold (Au) on the ceramic substrate to form the one or more drain portions; and
   forming the conductive bridge includes printing a conductive paste having at least gold (Au) on the dielectric pattern and over the one or more drain portions.

9. The method of claim 1, wherein:
   forming the conductive layer includes printing a conductive paste having at least silver (Ag) and palladium (Pd) on the ceramic substrate to form the one or more source portions and the one or more drain portions; and
   forming the conductive bridge includes printing a conductive paste having at least silver (Ag) and palladium (Pd) on the dielectric pattern and over the one or more drain portions.

10. The method of claim 1, wherein the dielectric pattern includes one or more openings for receiving one or more dies, the method further comprising:
    disposing the one or more dies on the one or more drain portions through the one or more openings.

11. The method of claim 1, wherein the dielectric pattern includes one or more notches for receiving one or more leads, the method further comprising:
    disposing the one or more leads on the conductive layer through the one or more notches.

12. A method for producing a multi-layer thick-film RF package, the method comprising:
    forming a conductive layer including one or more source portions and one or more drain portions on a ceramic substrate;
    firing the conductive layer and the ceramic substrate in a furnace;
    forming a dielectric pattern on the conductive layer;
    firing the dielectric pattern in the furnace; and
    forming a conductive bridge on the dielectric pattern, over the one or more drain portions and between the one or more source portions; wherein
    forming the conductive bridge includes printing a conductive paste on the dielectric pattern over the one or more drain portions, and
    forming the conductive bridge further includes connecting the one or more source portions through one or more openings in the dielectric pattern.

13. A method for producing a multi-layer thick-film RF package, the method comprising:
    forming a conductive layer including one or more source portions and one or more drain portions on a ceramic substrate;
    firing the conductive layer and the ceramic substrate in a furnace;
    forming a dielectric pattern on the conductive layer;
    firing the dielectric pattern in the furnace; and
    forming a conductive bridge on the dielectric pattern, over the one or more drain portions and between the one or more source portions; wherein
    forming the conductive layer includes printing a conductive paste having at least silver (Ag) and palladium (Pd) on the ceramic substrate to form the one or more source portions, and printing a conductive paste having at least gold (Au) on the ceramic substrate to form the one or more drain portions; and
    forming the conductive bridge includes printing a conductive paste having at least gold (Au) on the dielectric pattern and over the one or more drain portions.

14. A method for producing a multi-layer thick-film RF package, the method comprising:
    forming a conductive layer including one or more source portions and one or more drain portions on a ceramic substrate;
    firing the conductive layer and the ceramic substrate in a furnace;
    forming a dielectric pattern on the conductive layer;
    firing the dielectric pattern in the furnace; and
    forming a conductive bridge on the dielectric pattern, over the one or more drain portions and between the one or more source portions; wherein
    forming the conductive layer includes printing a conductive paste having at least silver (Ag) and palladium (Pd)

on the ceramic substrate to form the one or more source portions and the one or more drain portions; and forming the conductive bridge includes printing a conductive paste having at least silver (Ag) and palladium (Pd) on the dielectric pattern and over the one or more drain portions.

15. A method for producing a multi-layer thick-film RF package, the method comprising:

forming a conductive layer including one or more source portions and one or more drain portions on a ceramic substrate;

firing the conductive layer and the ceramic substrate in a furnace;

forming a dielectric pattern on the conductive layer;

firing the dielectric pattern in the furnace;

forming a conductive bridge on the dielectric pattern, over the one or more drain portions and between the one or more source portions;

wherein the dielectric pattern includes one or more openings for receiving one or more dies, the method further comprising:

disposing the one or more dies on the one or more drain portions through the one or more openings.

* * * * *